(12) United States Patent  (10) Patent No.: US 6,970,700 B1
Keane et al.  (45) Date of Patent: Nov. 29, 2005

(54) POWER DELIVERY SYSTEM

(75) Inventors: Anthony R. A. Keane, Webster, NY (US); Daniel F. Vona, Jr., Rochester, NY (US)

(73) Assignee: ENI Technology, Inc., Rochester, NY (US)

( * ) Notice: Subject to any disclaimer, the term of this patent is extended or adjusted under 35 U.S.C. 154(b) by 0 days.

(21) Appl. No.: 09/494,589

(22) Filed: Jan. 31, 2000

(51) Int. Cl.[7] .............................................. H04Q 7/20
(52) U.S. Cl. ................. 455/423; 455/424; 455/67.11; 455/67.12; 455/232.1; 455/233.1; 455/63.3; 455/64; 324/500; 324/520
(58) Field of Search ............................. 455/423, 67.1, 455/67.2, 230, 232.1, 233.1, 234.1, 67.11, 455/424, 64, 63.3, 67.12; 324/520, 500

(56) References Cited

U.S. PATENT DOCUMENTS

| | | | | |
|---|---|---|---|---|
| 4,846,920 A | * | 7/1989 | Keller et al. ............ 156/345.25 |
| 4,954,212 A | * | 9/1990 | Gabriel et al. ................. 216/61 |
| 5,273,610 A | * | 12/1993 | Thomas et al. .......... 156/345.28 |
| 5,472,561 A | * | 12/1995 | Williams et al. ............... 438/10 |
| 5,556,501 A | * | 9/1996 | Collins et al. .......... 156/345.38 |
| 5,576,629 A | * | 11/1996 | Turner et al. ................. 324/709 |
| 5,578,165 A | * | 11/1996 | Patrick et al. ................. 216/68 |
| 5,831,550 A | * | 11/1998 | Sigiliao Da Costa et al. ........ 340/870.05 |
| 5,939,886 A | * | 8/1999 | Turner et al. ................ 324/464 |
| 6,046,594 A | * | 4/2000 | Mavretic ..................... 324/520 |
| 6,049,219 A | * | 4/2000 | Hwang et al. ............... 324/765 |
| 6,449,726 B1 | * | 9/2002 | Smith .......................... 713/340 |

* cited by examiner

*Primary Examiner*—Marceau Milord
(74) *Attorney, Agent, or Firm*—Bryan Cave LLP; Lawrence G. Kurland, Esq.

(57) ABSTRACT

A method and apparatus for measuring the characteristics of radio frequency energy in an industrial radio frequency processing system at a plurality of frequencies is disclosed. The method and apparatus measures the characteristics of radio energy using one detector.

44 Claims, 4 Drawing Sheets

POWER DELIVERY SYSTEM

FIELD OF THE INVENTION

The present invention relates to data measurement in a plasma chamber. More particularly, the present invention relates to the measurement of multiple variables of different frequencies in a plasma chamber.

BACKGROUND OF THE INVENTION

In conventional applications involving plasma generation, it is often necessary to monitor the voltage, current, and the phase entering a plasma chamber from a power generator. Moreover, many conventional plasma generation applications involve the use of two or more power generators, wherein the power generators generate power at different frequencies. Typically, these conventional power generators will supply power at 2 MHz and 27 MHz.

In order to measure the voltage, current, and phase supplied to the chamber, it is often necessary to use a device known as a Radio Frequency (RF) probe. However, due to the size and cost of RF probes, it is desirable to use only one probe to measure the above parameters at different frequencies.

SUMMARY OF THE INVENTION

In a first embodiment of the invention, an apparatus for measuring the characteristics of radio frequency energy delivered in an industrial radio frequency processing system is disclosed. This apparatus comprises a plurality of generators for generating a plurality of power outputs onto a single transmission line at a plurality of frequencies, a detector for detecting the associated characteristics of the plurality of outputs, sensing the associated characteristics of a first generated output at a first frequency, alternating to a second frequency, and sensing the associated characteristics of the second generated output at the second frequency.

In a second embodiment of the present invention, a method for measuring characteristics of radio frequency energy delivered in an industrial radio frequency processing system is disclosed. This method comprises generating a first power output onto a transmission line at a first frequency, generating a second power output onto the transmission line at a second frequency, sensing the associated characteristics on the transmission line at the first frequency, switching to the second frequency, and sensing the associated characteristics on the transmission line at the second frequency using a common sensing means to sense said first frequency.

In a third embodiment of the present invention, an apparatus for measuring characteristics of radio frequency energy delivered in an industrial radio frequency processing system is disclosed. This apparatus comprises a plurality of generators for generating a plurality of power outputs onto a single transmission line, a plurality of tuners for tuning to a plurality of frequencies, and a detector for selecting one of the plurality of tuners and detecting the associated characteristics of the plurality of outputs at the frequency of the selected tuning means.

In a fourth embodiment of the present invention, a method for measuring characteristics of radio frequency energy delivered in an industrial radio frequency processing system is disclosed. This method comprises generating a first power output onto a transmission line at a first frequency, generating a second power output onto the transmission line at a second frequency, tuning a first tuner to the first frequency, tuning a second tuning means to the second frequency, selecting one of the tuning means, and sensing the associated characteristics on the transmission line at the frequency associated with the selected tuning means.

DETAILED DESCRIPTION

Figure 1:
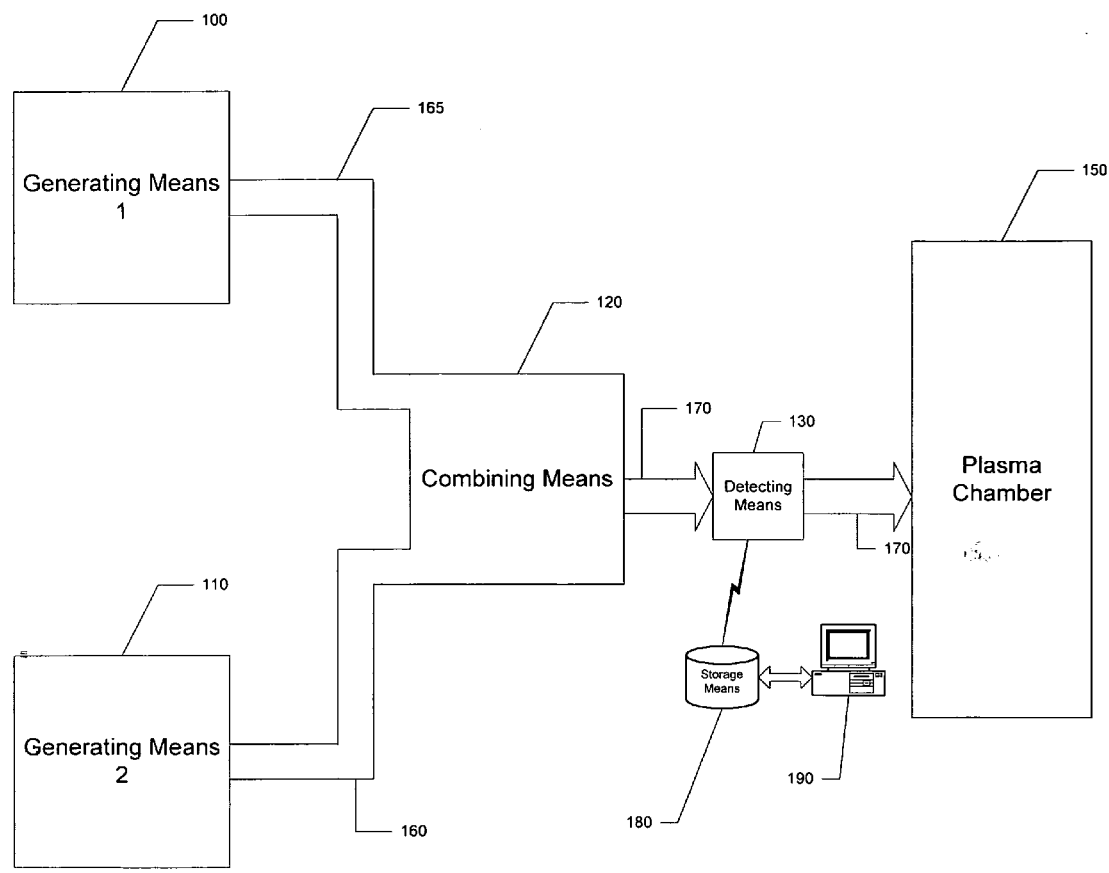
FIG. 1 is a general block diagram of the present invention.

Referring now to the drawings in detail, and initially to FIG. 1, an overview of the system configuration of a preferred embodiment in accordance with the present invention is depicted. The present invention may be used for measuring characteristics of radio frequency energy delivered in an industrial radio frequency processing system. In a preferred embodiment, it may be used in an industrial semi-conductor processing system, such as a plasma chamber. However, it may also be used in virtually any application that requires the measurement of radio frequency characteristics. For example, the present invention may also be used in the manufacture of optical disks.

The configuration shown in FIG. 1 preferably comprises a first generating means 100 for the output of power at a first frequency along an output path 165; a second generating means 110 for the output of power at a second frequency along a separate output path 160; a combining means 120, for combining the two output powers from paths 160 and 165; a detecting means 130 for detecting characteristics such as voltage, current and phase at a given frequency of the power output from the generating means, a storage means 180 and a computer 190 for receiving and storing data from the detecting means 130; and a plasma chamber 150. The generating means 100, 110, combining means 120, detecting means 130, storage means 180, computer 190, and plasma chamber 150 may be any conventional suitable commercially available component. For example, the generating means 100, 110 may be any suitable, commercially available radio frequency generator, such as an RF generator model number OEM-12b, available from ENI. The combining means 120 may be any suitable, commercially available electronic circuit capable of combining radio frequency energy at multiple frequencies onto a single power line. For example, commercially available high pass/low pass combination filters may be used. The storage means 180 may be any magnetic, optical (such as a DVD-ram or CDR), semi-conductor or other type of conventional storage device that is capable of storing data output from the detecting means 130. Likewise, the computer 190 may be any commercially available computer capable of interfacing with the detecting means 130. Moreover, the storage means 180 and computer means 190 may be individual units, such as a disk array connected to a computer, or may be a single unit, such as a computer with acceptable storage media. The detecting means may be a V/I-probe, available from ENI. The plasma chamber 150 may be any suitable, commercially available plasma chamber, such as those available from Lam Research, or Applied Materials. The transmission means 170 may be any suitable means for transmitting the power output from the generating means, and may be, for example, a power line or 50 ohm coaxial cable.

As noted above, although multiple frequencies are present on the transmission means 170, it would be desirable to detect the phase, voltage, and current supplied to the plasma chamber using only one RF probe.

Figure 2:
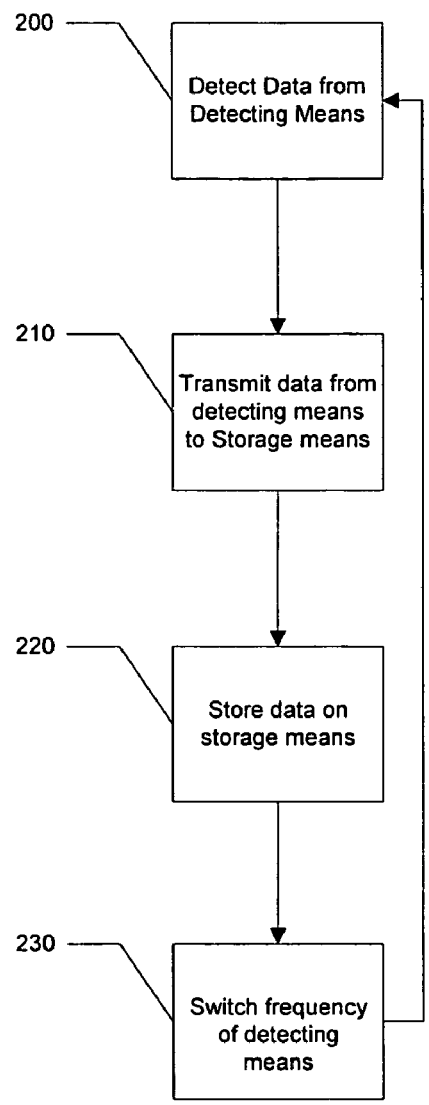
FIG. 2 is a flow chart of the system present invention.

Accordingly, the method depicted in FIG. 2 allows a single detecting means 130 of FIG. 1 to measure voltage, current, and phase at more than one frequency. It preferably accomplishes this by measuring the voltage, current, and phase at a first frequency, storing this data onto the storage means 180, switching the frequency of the common detecting means 130 to a second frequency, measuring the voltage, current, and phase at the second frequency, and storing that data on the storage means 180. When it is desired to collect data at more than two frequencies, the present method will cycle throughout all of the frequencies of interest.

As depicted in FIG. 2, the presently preferred method of the present invention comprises several steps. First, at step 200, the data is detected from the detecting means 130 at a first frequency. This data may be any data associated with the RF energy being supplied to the plasma chamber 150. For example, this data may comprise the supplied voltage, current, and phase. Next, at step 210, this data is transmitted from the detecting means 130 to a storage means 180. More specifically, when a V/I probe is used, the data is first stored in Ram local to the V/I probe's analysis electronics, and then transmitted to storage means 180 through a serial link. Depending on the size of the Ram present in the V/I probe, this may occur during or after the acquisition of other frequencies. At step 220, the transmitted data is stored on the storage means 180 interfaced to the detecting means 130, for use by the computer 190.

Next, at step 230, the detecting means 130 is switched to a second frequency, and the process is repeated by returning to step 200. The data received at the second frequency is stored in a second memory location of the storage means 180 and detecting means 130 is again switched back to the first frequency. As mentioned above, when it is desired to collect data at more than two frequencies, the present method will cycle throughout all the frequencies of interest before returning to the first.

The stored data points may then be plotted or displayed on the computer 190, or another conventional computer (not shown), conventionally connected to the system of the present invention. This method allows a single detecting means 130 to effectively monitor current, voltage, and phase at two different frequencies, without the need for a separate detection means for each frequency.

Figure 3:
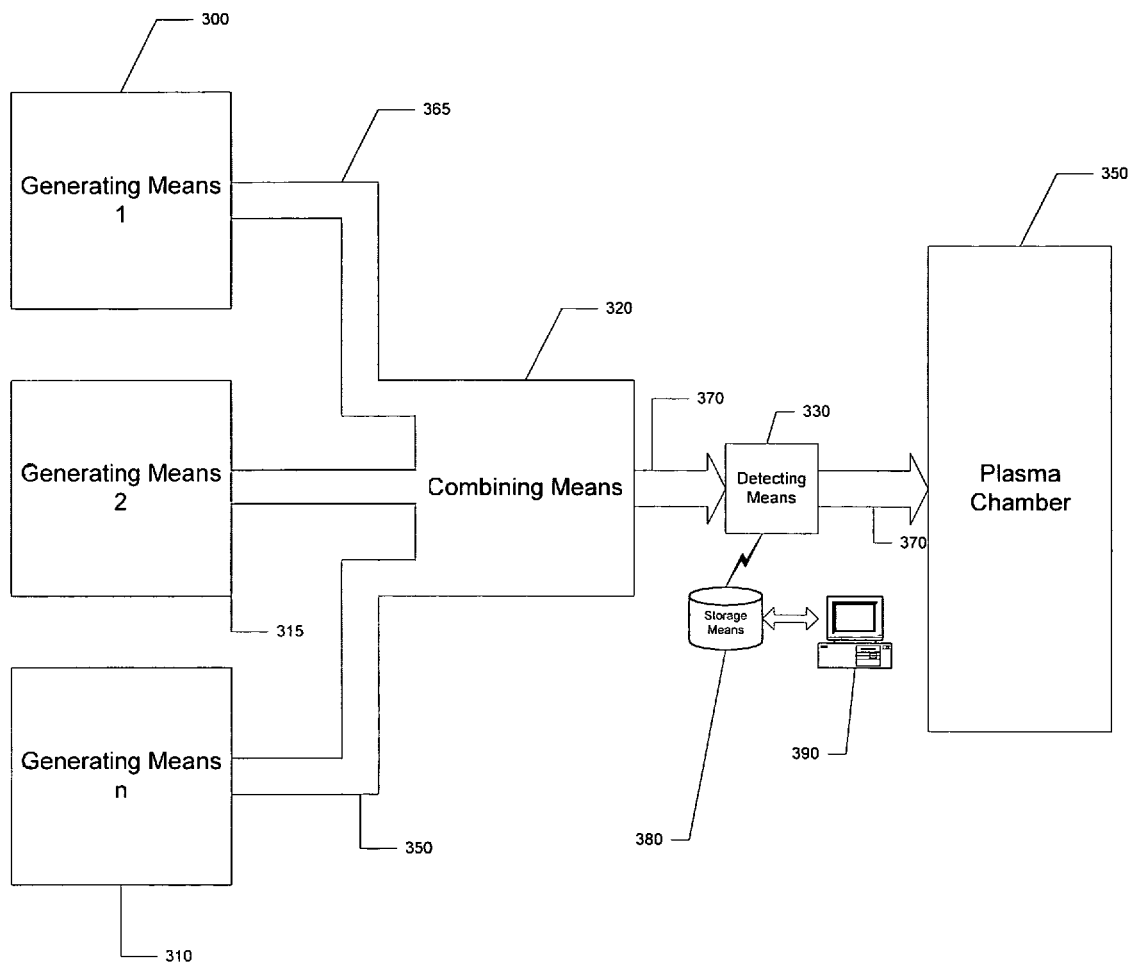
FIG. 3 is a block diagram of a first alternative embodiment of the present invention.

Turning now to FIG. 3, an alternative embodiment of the present invention is shown. In this embodiment, a plurality of generating means 300, 310, and 315 feeds the combining means 320. In this embodiment, the detecting means 330 measures data associated with the RF energy supplied to the plasma chamber 350 at a first frequency. This data may comprise the supplied voltage, current, and phase. This data is stored, and the detecting means 330 is switched to a second frequency. This is repeated until all the frequencies are cycled through, at which point the detecting means 330 is switched back to the first frequency.

This method may also be used in a situation where it is desired to collect data at different harmonics of the base frequency. Accordingly, the detecting means may actually be detecting data associated with the RF energy supplied to the plasma chamber at many more frequencies than is being generated by the generating means 300, 310, 315. For example, if there are only two fundamental frequencies being generated, i.e., 2 MHz and 27 MHz, it may also be desirable to detect data at harmonics of the generated frequencies, such as 4 MHz, 8 MHz, 54 MHz, and 81 MHz.

Figure 4:
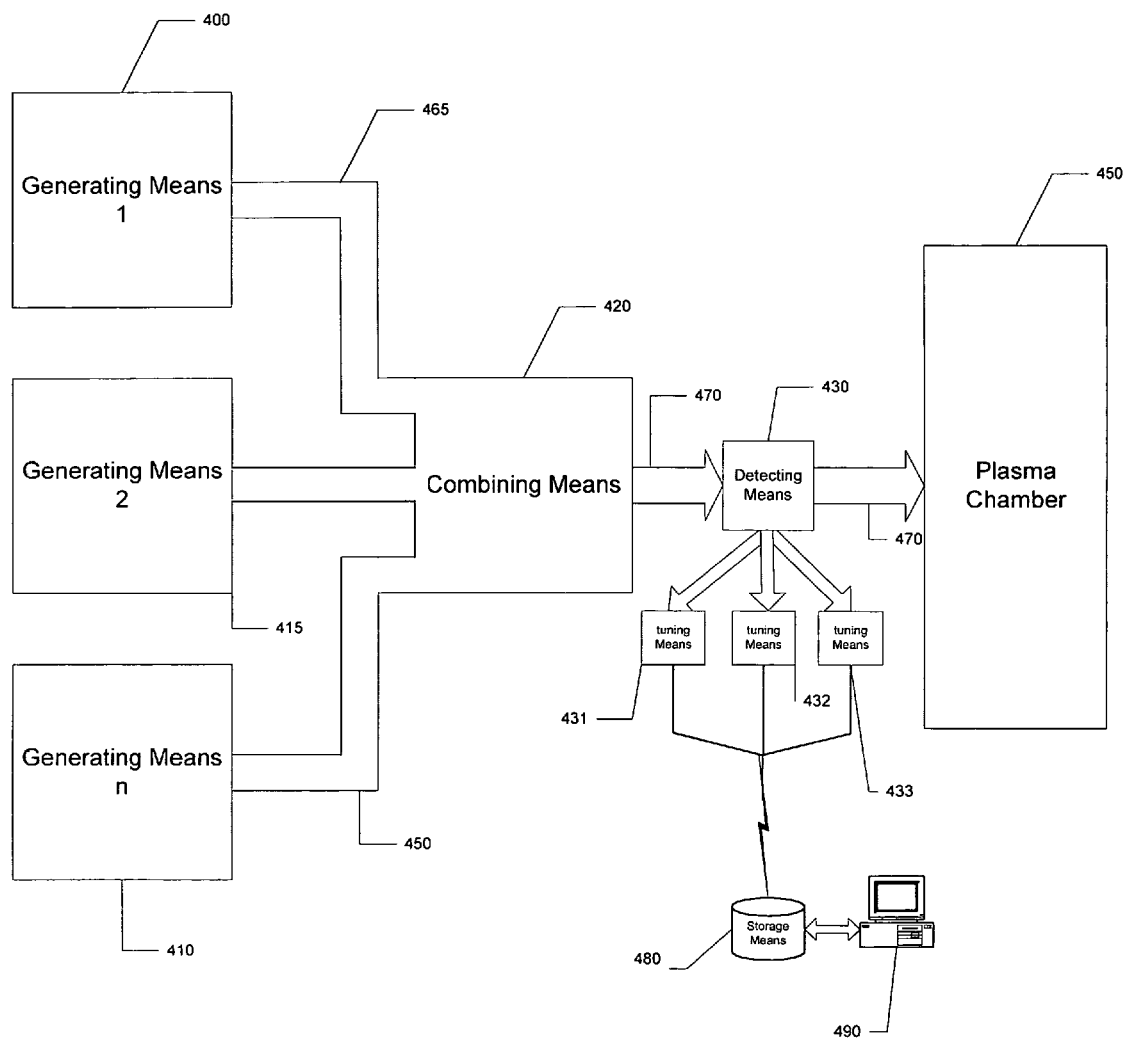
FIG. 4 is a block diagram of a second alternative embodiment of the present invention.

FIG. 4 depicts yet another embodiment of the present invention. In this embodiment, multiple tuning means 431, 432, and 433 are used in conjunction with the single detecting means 430. Although three tuning means are depicted, any number of tuning means may be used in this embodiment. For each generating means 400, 415, 410 present, or for each frequency data is to be collected at, a tuning means 431, 432, 433 is attached to the line 470. Each of these tuning means is tuned to a frequency that a generating means is operating at, or a frequency that data is to be collected at. In order to detect data at a specific frequency, the detecting means 430 switches to the desired tuning means.

Similarly, in yet another embodiment of the invention, any number of tuning means are used in conjunction with any number of generating means. The tuning means may then be tuned to any desired frequency. For example, the tuning means may be tuned to the harmonics of any of the frequencies generated by the generating means. For example, if there are only two frequencies being generated, i.e., 2 MHz and 27 MHz, it may also be desirable to detect data at harmonics of the generated frequencies, such as 4 MHz, 8 MHz, 54 MHz, and 81 MHz.

While the invention has been described in respect to the above embodiments of the invention, it should be understood that the invention is not limited to these precise embodiments. Rather, many modifications and variations will present themselves to persons skilled in the art without departing from the scope and spirit of the inventions, which is derived in the appended claims.

What is claimed is:

1. An apparatus for measuring the characteristics of radio frequency energy in an industrial radio frequency processing system comprising:
   a plurality of generator means for generating a plurality of power outputs onto a single transmission means, at a plurality of frequencies, each one of said plurality of outputs having associated characteristics; and
   common detection means for detecting said associated characteristics of said plurality of outputs, said common detection means comprising means for sensing said associated characteristics of a first generated output at a first frequency, alternating to a second frequency, and sensing said associated characteristics of said second generated output at said second frequency.

2. The apparatus of claim 1, wherein said radio frequency processing system comprises a semi-conductor processing system.

3. The apparatus of claim 1, wherein said radio frequency processing system comprises an optical disk processing system.

4. The apparatus of claim 1, wherein said associated characteristics of said plurality of said outputs comprises voltage, current, and phase.

5. The apparatus of claim 1, further comprising a combining means operatively connected to said plurality of generator means for combining said plurality of outputs onto a single transmission means.

6. The apparatus of claim 1, wherein said plurality of generator means comprises two generator means, and said plurality of frequencies comprises two frequencies.

7. The apparatus of claim 1, wherein said plurality of frequencies are different frequencies.

8. The apparatus of claim 1, wherein one of said plurality of frequencies comprises 2 MHz.

9. The apparatus of claim 1, wherein one of said plurality of frequencies comprises 27 MHz.

10. The apparatus of claim 1, wherein said plurality of frequencies comprises a first and second frequency, and said second frequency is a harmonic of said first frequency.

11. The apparatus of claim 1, further comprising storage means operatively connected to said common detection means for storing data provided from said common detection means, said common detection means comprising means for transmitting a value of said sensed associated characteristics of a first generated power output at a first frequency to said storage means for storing said sensed value as data.

12. A method for measuring characteristics of radio frequency energy delivered in an industrial radio frequency processing system comprising:
   generating a first power output onto a transmission means at a first frequency, said first power output having associated characteristics;
   generating a second power output onto said transmission means at a second frequency, said second power output having said associated characteristics;
   sensing said associated characteristics on said transmission means at said first frequency;
   switching to said second frequency; and
   sensing said associated characteristics on said transmission means at said second frequency using a common sensing means used to sense said first frequency.

13. The apparatus of claim 12, wherein said radio frequency processing system comprises a semi-conductor processing system.

14. The apparatus of claim 12, wherein said radio frequency processing system comprises an optical disk processing system.

15. The method of claim 12, wherein said associated characteristics comprise voltage, current, and phase.

16. The method of claim 12, further comprising the step of combining said first and second power outputs onto a single transmission means.

17. The method of claim 12, further comprising the step of storing said sensed associated characteristics of said first generated power output at said first frequency.

18. The method of claim 12, further comprising the step of storing said sensed associated characteristics of said second generated power output at said second frequency.

19. The method of claim 12, wherein said first and second frequencies are different.

20. The method of claim 12, wherein said first frequency comprises 2 MHz.

21. The method of claim 12, wherein said second frequency comprises 27 MHz.

22. The method of claim 12, wherein said second frequency is a harmonic of said first frequency.

23. An apparatus for measuring characteristics of radio frequency energy delivered in an industrial radio frequency processing system comprising:
   a plurality of generator means for generating a plurality of power outputs onto a single transmission means at a plurality of frequencies, each one of said plurality of outputs having associated characteristics;
   a plurality of tuning means for tuning to said plurality of frequencies; and
   common detection means for selecting one of said plurality of tuning means and detecting said associated characteristics of said plurality of outputs at the frequency of said selected tuning means.

24. The apparatus of claim 23, wherein said radio frequency processing system comprises a semi-conductor processing system.

25. The apparatus of claim 23, wherein said radio frequency processing system comprises an optical disk processing system.

26. The apparatus of claim 23, wherein said associated characteristics of said plurality of said outputs comprises voltage, current, and phase.

27. The apparatus of claim 23, further comprising a combining means operatively connected to said plurality of generator means for combining said plurality of outputs onto a single transmission means.

28. The apparatus of claim 23, wherein said plurality of generator means comprises two generator means, and said plurality of frequencies comprises two frequencies.

29. The apparatus of claim 23, wherein said plurality of frequencies are different frequencies.

30. The apparatus of claim 23, wherein one of said plurality of frequencies comprises 2 MHz.

31. The apparatus of claim 23, wherein one of said plurality of frequencies comprises 27 MHz.

32. The apparatus of claim 23, wherein one of said plurality of tuning means is tuned to a harmonic frequency of one of said plurality of frequencies.

33. The apparatus of claim 23, further comprising storage means operatively connected to said common detection means for storing data provided from said common detection means, said common detection means comprising means for transmitting a value of said sensed associated characteristics of a first generated power output at a first frequency to said storage means for storing said sensed value as data.

34. A method for measuring characteristics of radio frequency energy delivered in an industrial radio frequency processing system comprising:
   generating a first power output onto a transmission means at a first frequency, said first power output having associated characteristics;
   generating a second power output onto said transmission means at a second frequency, said second power output having said associated characteristics;
   tuning a first tuning means to said first frequency;
   tuning a second tuning means to said second frequency;
   selecting one of said tuning means; and
   sensing said associated characteristics on said transmission means at said frequency associated with said selected tuning means.

35. The apparatus of claim 34, wherein said radio frequency processing system comprises a semi-conductor processing system.

36. The apparatus of claim 34, wherein said radio frequency processing system comprises an optical disk processing system.

37. The method of claim 34, wherein said associated characteristics comprise voltage, current, and phase.

38. The method of claim 34, further comprising the step of combining said plurality of power outputs onto a single transmission means.

39. The method of claim 34, further comprising the step of storing said sensed associated characteristics of said first generated power output at a first frequency.

40. The method of claim 34, further comprising the step of storing said sensed associated characteristics of said second generated power output at said second frequency.

41. The method of claim 34, wherein said first and second frequencies are different.

42. The method of claim 34, wherein said first frequency comprises 2 MHz.

43. The method of claim 34, wherein said second frequency comprises 27 MHz.

44. The method of claim 34, wherein said second frequency is a harmonic of said first frequency.

* * * * *